(12) United States Patent
Choi et al.

(10) Patent No.: US 9,634,510 B2
(45) Date of Patent: Apr. 25, 2017

(54) METHOD OF CONTROLLING CHARGING AND DISCHARGING OF BATTERY ENERGY STORAGE DEVICE AND THE BATTERY ENERGY STORAGE DEVICE FOR THE SAME

(71) Applicant: LSIS CO., LTD., Anyang-si, Gyeonggi-do (KR)

(72) Inventors: Eun Sik Choi, Incheon (KR); Yun Jae Lee, Gunpo-si (KR)

(73) Assignee: LSIS CO., LTD., Anyang-si (KR)

( * ) Notice: Subject to any disclaimer, the term of this patent is extended or adjusted under 35 U.S.C. 154(b) by 188 days.

(21) Appl. No.: 14/569,261

(22) Filed: Dec. 12, 2014

(65) Prior Publication Data
US 2015/0214754 A1   Jul. 30, 2015

(30) Foreign Application Priority Data

Jan. 27, 2014   (KR) .................. 10-2014-0009704

(51) Int. Cl.
*H02J 7/00*    (2006.01)
*G01R 31/36*   (2006.01)

(52) U.S. Cl.
CPC ............ *H02J 7/007* (2013.01); *H02J 7/0075* (2013.01); *G01R 31/3606* (2013.01)

(58) Field of Classification Search
CPC .............................. H02J 7/007; G01R 31/3606
USPC ............................................ 320/134; 702/63
See application file for complete search history.

(56) References Cited

U.S. PATENT DOCUMENTS

| | | | | |
|---|---|---|---|---|
| 5,600,566 A | * | 2/1997 | Park | G01R 31/3624 320/DIG. 21 |
| 8,018,203 B2 | * | 9/2011 | Nishi | B60K 6/365 320/124 |
| 8,548,761 B2 | * | 10/2013 | Lim | B60L 3/0046 320/132 |
| 2010/0090532 A1 | | 4/2010 | Shelton et al. | |
| 2016/0020495 A1 | * | 1/2016 | Koba | H01M 2/12 320/107 |

FOREIGN PATENT DOCUMENTS

| | | |
|---|---|---|
| JP | 2012-143018 | 7/2012 |
| JP | 2013-169068 | 8/2013 |

OTHER PUBLICATIONS

Japan Patent Office Application Serial No. 2015-004197, Notice of Allowance dated May 10, 2016, 3 pages.

* cited by examiner

*Primary Examiner* — M'Baye Diao
(74) *Attorney, Agent, or Firm* — Lee, Hong, Degerman, Kang & Waimey PC

(57) ABSTRACT

A method of charging and discharging battery energy storage device is provided. The method includes measuring a voltage and a frequency of a grid, measuring a state of charge (SOC) value of a battery, calculating an SOC offset value and an SOC feedback gain value from the measured SOC value of the battery, and performing a voltage droop control based on the voltage of the grid and a frequency droop control on the basis of the frequency of the grid, the SOC offset value and the SOC feedback gain value and controlling charging and discharging of the battery.

11 Claims, 8 Drawing Sheets

METHOD OF CONTROLLING CHARGING AND DISCHARGING OF BATTERY ENERGY STORAGE DEVICE AND THE BATTERY ENERGY STORAGE DEVICE FOR THE SAME

CROSS-REFERENCE TO RELATED APPLICATIONS

Pursuant to 35 U.S.C. §119(a), this application claims the benefit of earlier filing date and right of priority to Korean Patent Application No. 10-2014-0009704, filed on 27 Jan. 2014, the contents of which are hereby incorporated by reference herein in its entirety.

BACKGROUND

The present disclosure relates to a method of controlling charging and discharging of a battery energy storage device, and particularly, to a method of controlling charging and discharging of a battery energy storage device by performing a droop control using state of charge (SOC) offset values and SOC feedback gain values and preventing overcharging or over-discharging that may occur due to long time driving in order to efficiently and stably operate an energy storage device to be driven for a long time, and the battery energy storage device for the same.

A battery energy storage system (BESS) performs functions of storing, in a battery, power generated in a grid or providing power stored in the battery to the grid or a load.

FIG. 1 illustrates a view for explaining a typical BESS.

Referring to FIG. 1, a BESS 1 is connected to a grid 2 and a load 3, and may store power provided from the grid 2 or, on the contrary, provide power to the grid 2 or the load 3.

On the other hand, when receiving a target power value from an energy management system (EMS), which is an upper layer controller, according to a control mode, the BESS 1 provides the target power value to the grid 2 or charges the battery. When a frequency or a voltage of the grid 2 is changed according to a sharp load or an incident, the BESS 1 provides active power or reactive power to the grid 2 by using a droop control.

The droop control is a method that an energy storage device controls active power or reactive power stored in the battery using slopes for a frequency variation and a voltage variation of the grid.

FIG. 2 is a block diagram for explaining the droop control in a typical energy storage device.

Referring to FIG. 2, the typical energy storage device obtains a difference between a reference frequency f0 and a frequency f of the grid and obtains a reference droop power Pdroop_ref by dividing the difference by a frequency droop coefficient. Then, the reference droop power Pdroop_ref is added to target power PDG0 of an energy management system and the added result is used as an output value of the energy storage device.

Similarly, the typical energy storage device obtains a difference between a reference voltage V0 and a voltage V of the grid, and obtains a reference droop power Qdroop_ref by dividing the difference by a voltage droop coefficient. Then, the reference droop power Qdroop_ref is added to target power QDG0 of the energy management system and the added result is used as an output value of the energy storage device.

Accordingly, the output value at this point becomes to have an output curve illustrated in FIGS. 3a and 3b.

FIGS. 3a and 3b illustrate output curves of a frequency droop control and a voltage droop control in the typical BESS.

Referring to FIGS. 3a and 3b, when the load increases, the frequency decreases. Therefore, an energy device 10 performs charging for increasing an output. On the contrary, when the load decreases, the frequency increases. Therefore, the energy device 10 performs discharging for decreasing the output.

Basically, droop coefficients Rf and Rv used for a control may be derived by using the following Equation (1):

$$R_f = -\frac{f_{max} - f_{min}}{2(P_{max} * \eta_{PCS})} \quad (1)$$

$$R_V = -\frac{V_{max} - V_{min}}{2 * \sqrt{S_{PCS}^2 - P_{PCS}^2}}$$

However, since the typical droop controller performs charging or discharging without consideration of SOC of the battery, and since the system is stopped due to overcharging or over-discharging in a case of a long time control, driving of the energy storage device 10 may not be possible in an urgent situation.

SUMMARY

Embodiments provide a method of controlling charging and discharging a battery energy storage device by performing a droop control using state of charge (SOC) offset values and SOC feedback gain values and preventing overcharging or over-discharging that may occur due to long time driving in order to efficiently and stably operate an energy storage device to be driven for a long time, and the battery energy storage device for the same.

Technical issues obtainable from the present invention are not limited to the above mentioned. And, other unmentioned technical issues can be clearly understood from the following description by those skilled in the art to which the present invention pertains.

In one embodiment, a method of charging and discharging battery energy storage device, includes: measuring a voltage and a frequency of a grid; measuring a state of charge (SOC) value of a battery; calculating an SOC offset value and an SOC feedback gain value from the measured SOC value of the battery; and performing a voltage droop control based on the voltage of the grid and a frequency droop control on the basis of the frequency of the grid, the SOC offset value and the SOC feedback gain value and controlling charging and discharging of the battery.

The controlling of the charging and discharging may include adjusting a charging period and a discharging period of an entire period on the basis of the SOC offset value.

The SOC offset value calculates according to the following equation:

$$SOC_{offset} = \frac{SOC_{ref} - SOC_{feed}}{100} * P\max$$

where, SOCref denotes a reference SOC value, SOCfeed denotes a SOC value measured in the battery, and Pmax denotes maximum power of the grid.

Te SOCref may be a median value 50% of the SOC, and when the SOC is 50%, the SOC offset value becomes 0, when the SOC is between 0% and 50%, an absolute value of the SOC offset value increases as the SOC approaches 0% in a state where the SOC offset value has a positive value, and when the SOC value is between 50% and 100%, the absolute value of the SOC offset value increases as the SOC approaches 100% in a state where the SOC offset value has a negative value.

The controlling of the charging and discharging may include adjusting a charging amount and a discharging amount on the basis of the SOC feedback gain value.

The SOC feedback gain value may be calculated by the following equation:

$$\text{If } SOC \leq 50$$
$$\frac{SOC_{feed}}{100} * 2$$
$$\text{Else if } SOC > 50$$
$$\left\| \frac{SOC_{feed}}{100} * 2 - 2 \right\|$$

where, SOCfeed denotes an SOC value of the battery.

The controlling of the charging and discharging may include: operating the SOC offset value to a grid target power value set in the grid and outputting a first operation result; operating a frequency droop coefficient to a frequency difference between a reference frequency of the grid and a measured frequency of the grid and outputting a second operation result; operating the SOC feedback gain value to the frequency droop coefficient operation result and outputting a second operation result; operating the second operation result to the first operation result and outputting a reference power value; and obtaining a difference between the reference power value and a power value of the grid and performing a charging and discharging control.

The controlling of the charging and discharging may include: operating a frequency droop coefficient to a frequency difference between a reference frequency of the grid and a measured frequency of the grid; operating the SOC feedback gain value to the frequency droop coefficient operation result and outputting a first operation result; operating the first operation result to the grid target power value set to the grid and outputting a second operation result; operating the SOC offset value to the second operation result and outputting a reference power value; and obtaining a difference between the reference power value and the grid power value and controlling the charging and discharging.

The controlling of the charging and discharging may include: operating a frequency droop coefficient to a frequency difference value between a reference frequency of the grid and the measured frequency of the grid; operating the SOC feedback gain value to the frequency droop coefficient operation result and outputting a first operation result; operating the SOC offset value and the first operation result and outputting a second operation result; operating the second operation result to the grid target power value set to the grid and outputting a reference power value; and obtaining a difference value between the reference power value and a power value of the grid and performing a charging and discharging control.

In another embodiment, a battery energy storage device include: a battery; a data storage unit storing data necessary for a voltage droop control and a frequency droop control for the battery; an SOC measuring unit measuring an SOC value of the battery; a grid voltage and frequency measuring unit measuring a voltage and a frequency of the grid; a charging and discharging control unit performing the voltage droop control and frequency droop control corresponding to the voltage and frequency of the grid by using the data stored in the data storage unit, and an SOC offset value and an SOC feedback gain value of the battery, which are calculated on the basis of the SOC value, and outputting a control signal for performing charging and discharging on the battery while preventing overcharging and over-discharging at the time of charging and discharging the battery; and a charging and discharging unit charging or discharging the battery according to the control signal for performing charging and discharging of the charging and discharging control unit.

The data storage unit may store a voltage droop control coefficient, a frequency droop control coefficient, a reference SOC value of the battery, a reference voltage value of the grid, a reference frequency value of the grid, a target power value of the grid.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings. The invention may, however, be embodied in many different forms and should not be construed as being limited to the embodiments set forth herein; rather, that alternate embodiments included in other retrogressive inventions or falling within the spirit and scope of the present disclosure can easily be derived through adding, altering, and changing, and will fully convey the concept of the invention to those skilled in the art.

The terms used in this specification were selected to include current, widely-used, general terms, in consideration of the functions of the present invention. In certain cases, a term may be one that was arbitrarily established by the applicant. In such cases, the meaning of the term will be defined in the relevant portion of the detailed description. As such, the terms used in the specification are not to be defined simply by the name of the terms but are to be defined based on the meanings of the terms as well as the overall description of the present invention.

In other words, the terms "comprises" and/or "comprising" used herein specify the presence of stated elements or operations, but do not preclude the presence or addition of one or more other elements or operations.

Figure 1:
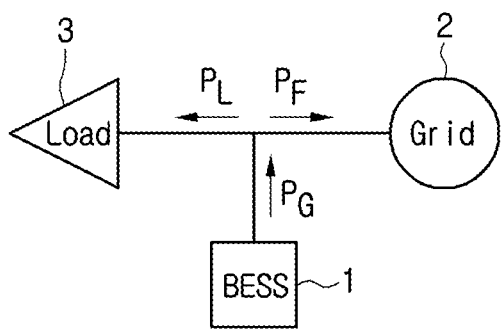
FIG. 1 is a view for explaining a typical energy storage device.
Figure 2:
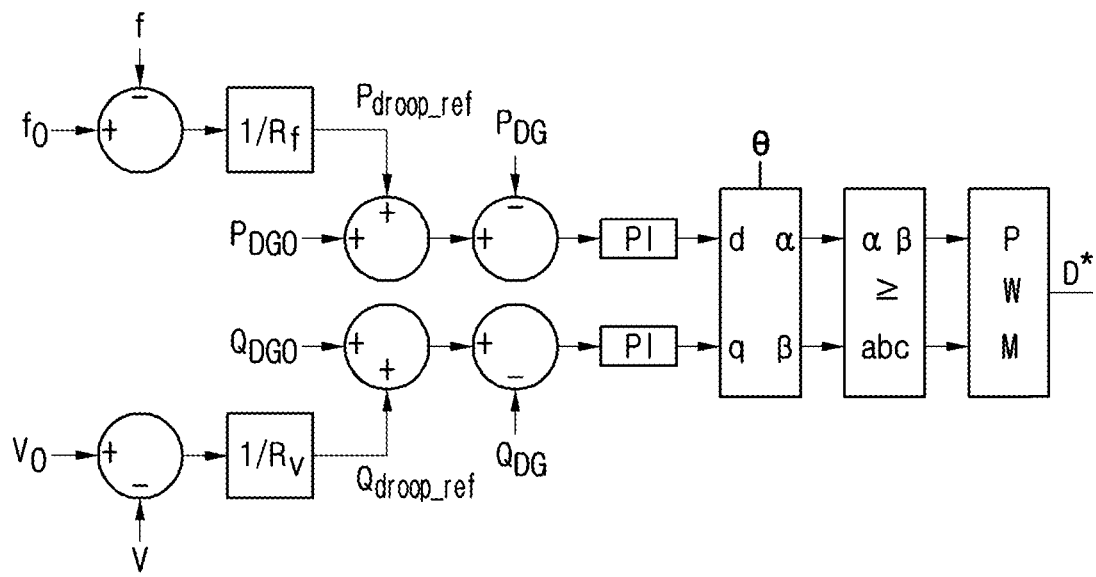
FIG. 2 is a block diagram for explaining a droop control in the typical energy storage device.
Figure 3A:
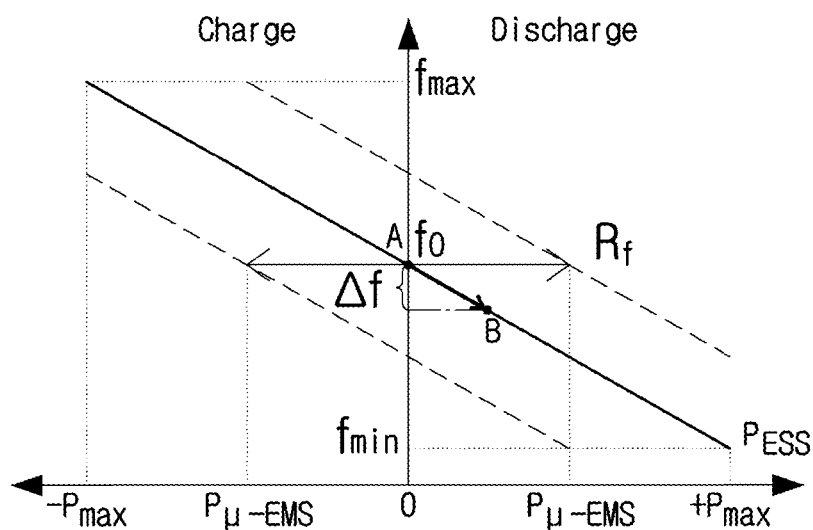
FIGS. 3a and 3b illustrate output curves of a frequency droop control and a voltage droop control in the typical battery energy storage device.
Figure 3B:
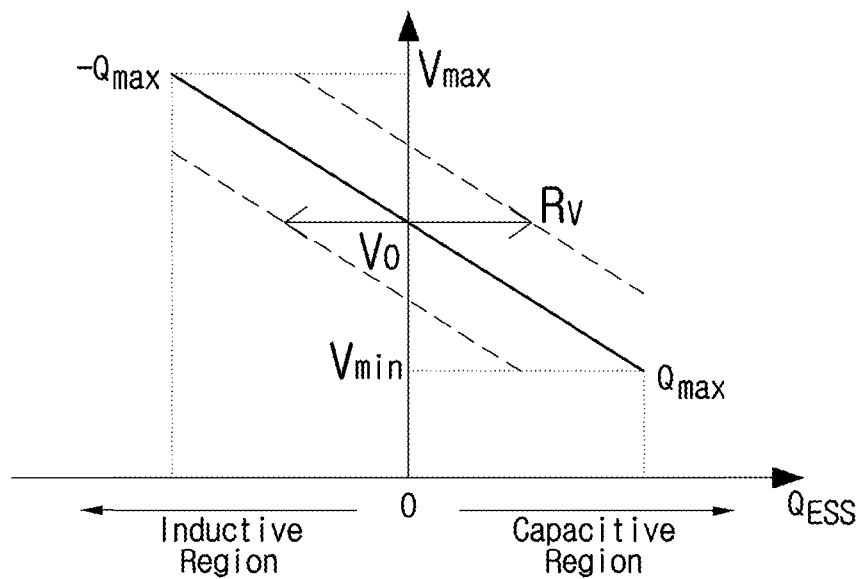
Figure 4:
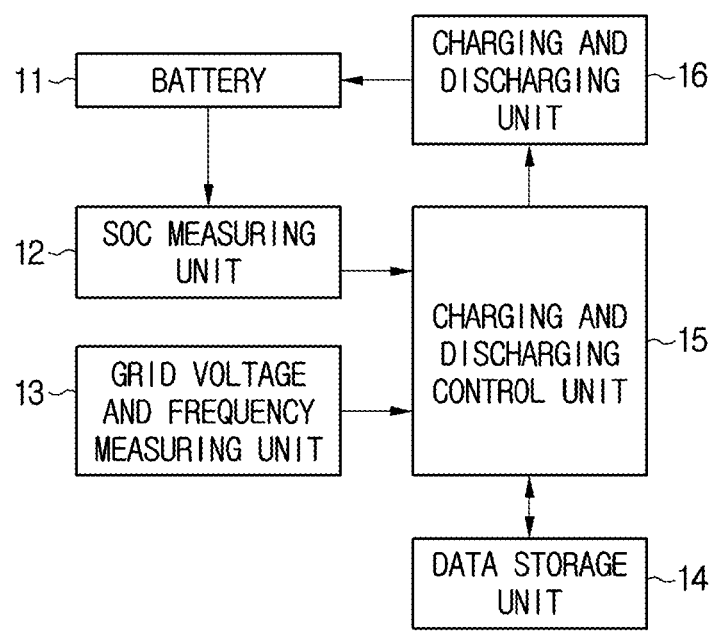
FIG. 4 is a view for explaining a battery energy storage device according to an embodiment.

FIG. 4 is a view for explaining a battery energy storage device according to an embodiment.

Referring to FIG. 4, the battery energy storage device 10 may include a battery 11, an SOC measuring unit 12 measuring an SOC value of the battery 11, a grid voltage and frequency measuring unit 13, a data storage unit 14, a charging and discharging control unit 15 controlling charging and discharging of the battery 11 by a voltage droop control and a frequency droop control using a offset value of the SOC value and an SOC feedback gain value of the battery 11, and a charging and discharging unit 16.

The battery 11 is charged or discharged by the battery energy storage device 10.

The SOC measuring unit 12 measures the SOC value of the battery 11 and provides the SOC value to the charging and discharging control unit 15.

The grid voltage and frequency measuring unit 13 measures a voltage and frequency of the grid and provide them to the charging and discharging control unit 15.

The data storage unit 14 stores a voltage droop control coefficient Rv, a frequency droop control coefficient Rf, a reference SOC value of the battery 11, a reference voltage value Vref of a grid, a reference frequency value fref of the grid, a target power value PDG0 or QDG0 of the grid necessary for charging and discharging the battery using a droop control in the battery energy storage device 10.

The charging and discharging control unit 15 prevents overcharging or over-discharging at the time of charging or discharging the battery and outputs, to the charging and discharging unit 16, a control signal for performing the charging and discharging of the battery 11 by performing the voltage droop control and the frequency droop control using an offset value of the SOC value of the battery 11 and the SOC feedback gain value.

The charging and discharging unit 16 performs charging or discharging for the battery 11 according to a charging or discharging control signal from the charging and discharging control unit 15.

Figure 5:
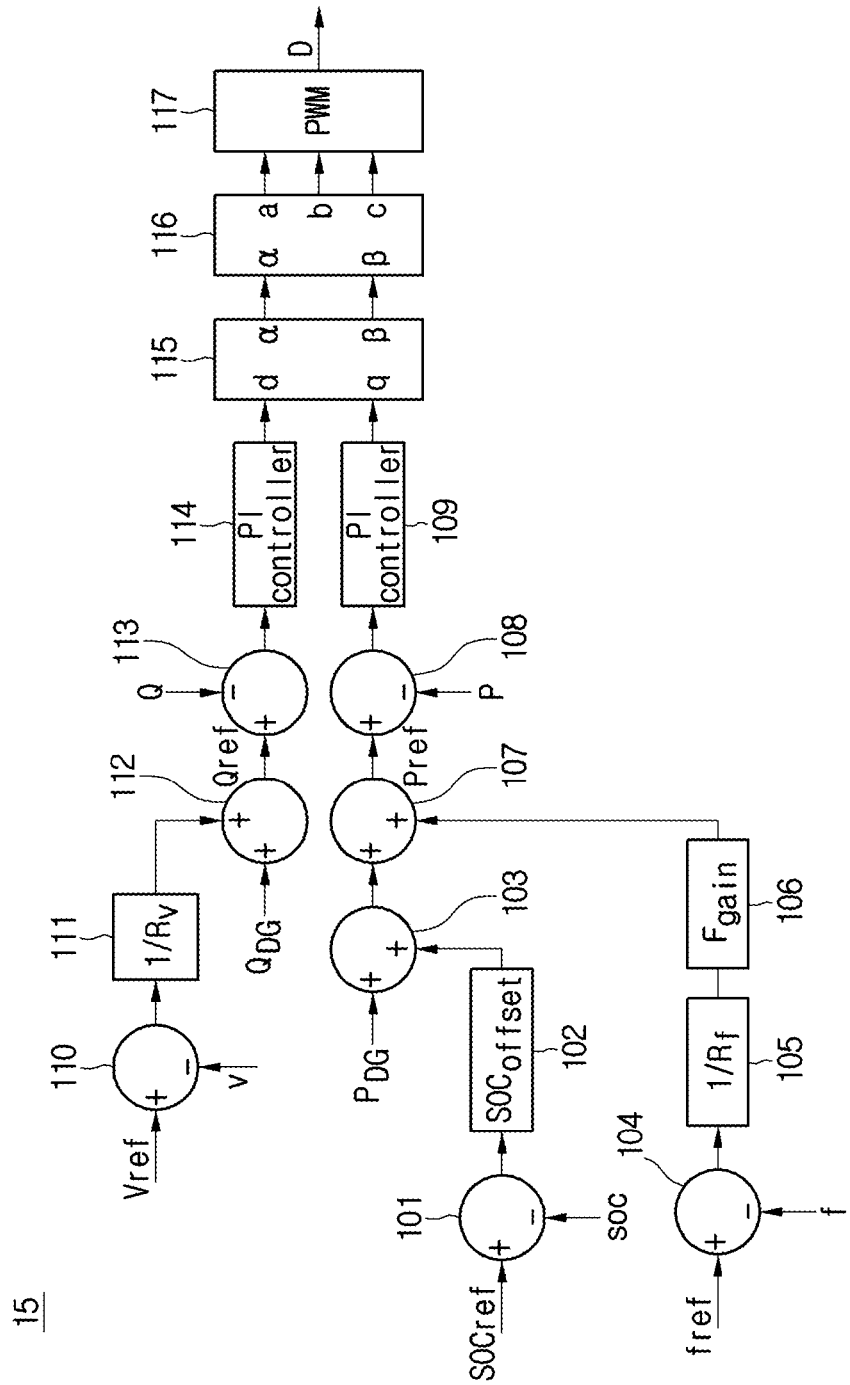
FIG. 5 is a view for explaining a method of controlling charging and discharging of a battery energy storage device according to an embodiment.

FIG. 5 illustrates a method of controlling charging and discharging by a battery energy storage device according to an embodiment.

Referring to FIG. 5, the battery energy storage device according to an embodiment may include a first operator 101, an SOC offset operator 102, a second operator 103, a third operator 104, a frequency droop coefficient operator 105, a feedback gain operator 106, a fourth operator 107, a fifth operator 108, a first proportional-integral (P1) controller 109, a sixth operator 110, a voltage droop coefficient operator 111, a seventh operator 112, an eighth operator 113, a second PI controller 114, a first conversion unit 115, a second conversion unit 116, and a pulse width modulation (PWM) controller 117.

The first operator 101 obtains an SOC difference between a reference SOC value SOCref of the battery 11 and an SOC value soc measured from the battery 11. The SOC offset operator 102 calculates an SOC offset value from the SOC difference output from the first operator 101 and outputs the SOC offset value.

The second operator 103 adds the SOC offset value of the SOC offset operator 102 to the grid target power value PDG and outputs the added result.

The third operator 104 obtains a frequency difference between a reference frequency f0 of the grid and a frequency f of the grid, which is measured from the grid. The frequency droop coefficient operator 105 divides the frequency difference output from the third operator 104 by the frequency droop coefficient and outputs the divided result. The feedback gain operator 106 calculates a feedback gain value from the output value of the frequency droop coefficient operator 105 and outputs the feedback gain value.

The fourth operator 107 adds the feedback gain value of the feedback gain operator 106 to the output value of the second operator 103 and outputs the added result as the reference power value Pref.

The fifth operator 108 obtains a difference between the reference power value Pref and a power value P of the grid and outputs the difference to the first PI controller 109.

The first PI controller 109 performs a proportional-integral control on the output of the fourth operator 107. At this point, an output of the PI controller 109 becomes to have a DC component.

The sixth operator 110 obtains a voltage difference between the reference value Vref and a voltage V of the grid. The voltage droop coefficient operator 111 divides the voltage difference output from the sixth operator 110 by the voltage droop coefficient and output the divided result.

The seventh operator 112 adds the output value of the voltage droop coefficient operator 111 to the grid target power value QDG and outputs the added result as the reference power value Qref.

The eighth operator 113 obtains a difference between the reference power value Qref and the power value Q of the grid and outputs the difference to the second PI controller 114.

The second PI controller 114 performs proportional-integral control on the output of the eighth operator 113. At this point, the output of the second PI controller 114 has a DC component.

The first and second conversion units 115 and 116 convert output signals of the first and second PI controller 109 and 114 from DC signals into AC signals.

At this point, the first conversion unit 115 performs conversion from a d-q axis into an α-β axis, and the second conversion unit 116 performs axis-conversion from the α-β axis to an a, b, c axis on the output of the first conversion unit 115 and a sinusoidal wave, which is a three-phase AC signal, is output.

The PWM controller 117 generates a PWM signal for controlling power of the grid from the output of the second conversion unit 116 and output the PWM signal.

The SOC offset value may be calculated with the following Equation 2:

$$SOC_{offset} = \frac{SOC_{ref} - SOC_{feed}}{100} * P\max \quad (2)$$

where, SOCref denotes a reference SOC value, SOCfeed denotes a SOC value measured in the battery, and Pmax denotes maximum power of the grid.

Figure 6:
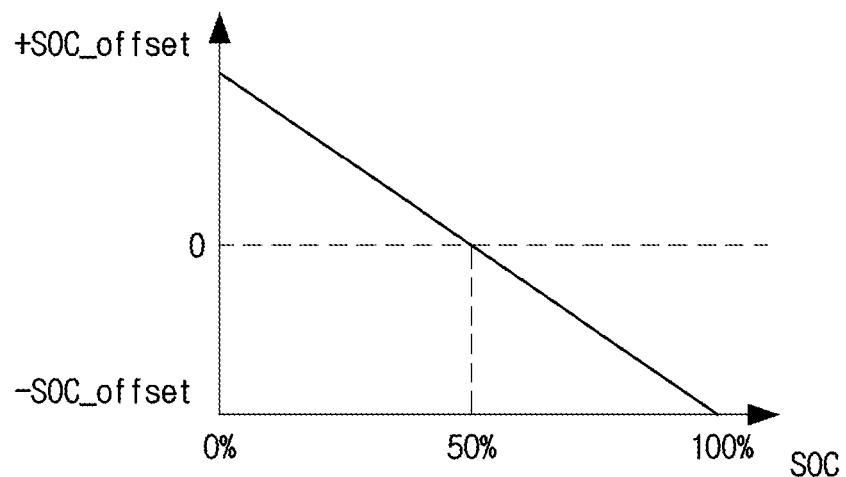
FIG. 6 illustrates an output curve of an SOC offset value used for a droop control in an energy storage device according to an embodiment.

FIG. 6 illustrates an output curve of the SOC offset value used for a droop control in an energy storage device according to an embodiment.

Referring to FIG. 6, the output curve of the SOC offset value obtained by Equation (2) may be confirmed. SOCref is arbitrarily set by a user and, here, is set as 50% which is a median value of the SOC. Accordingly, when the SOC is 50%, the SOC offset value becomes 0. When the SOC is between 0% and 50%, an absolute value of the SOC offset value increases as the SOC approaches 0% in a state where the SOC offset value has a positive value.

On the other hand, when the SOC is between 50% and 100%, the absolute value of the SOC offset value increases as the SOC approaches 100% in a state where the SOC offset value has a negative value.

The SOC feedback gain value may be calculated by the following Equation 3:

$$\text{If } SOC \leq 50 \qquad (3)$$
$$\frac{SOC_{feed}}{100} * 2$$
$$\text{Else if } SOC > 50$$
$$\left\| \frac{SOC_{feed}}{100} * 2 - 2 \right\|$$

where, SOCfeed denotes the SOC value of the battery.

Figure 7:
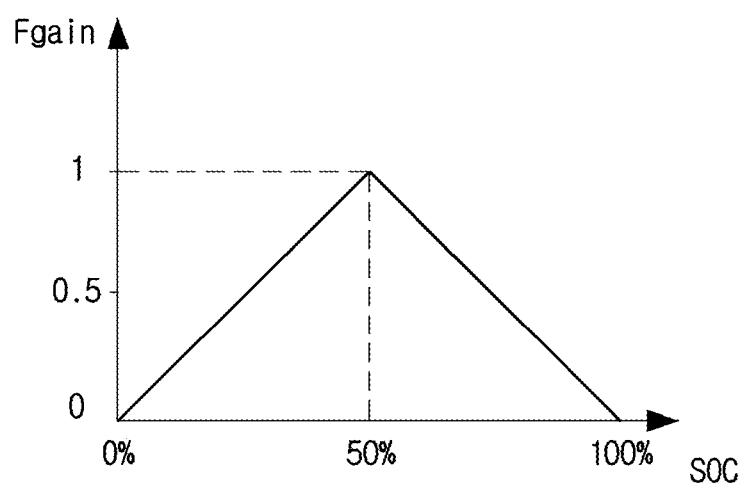
FIG. 7 illustrates an output curve of an SOC feedback gain used for a droop control in an energy storage device according to an embodiment.

FIG. 7 illustrates an output curve of an SOC feedback gain used for a droop control in an energy storage device according to an embodiment.

SOCref may be arbitrarily set by the user and, here, is set as 50%, which is a median value of the SOC. Accordingly, when the SOC is 50%, the SOC feedback gain becomes 1. When the SOC is between 0% and 50%, an absolute value of the SOC offset value decreases as the SOC approaches 0% in a state where the SOC offset value is between 0 and 1.

On the other hand, when the SOC is between 50% and 100%, the absolute value of the SOC offset value decreases as the SOC approaches 100% in a state where the SOC offset value is between 0 and 1.

Figure 8:
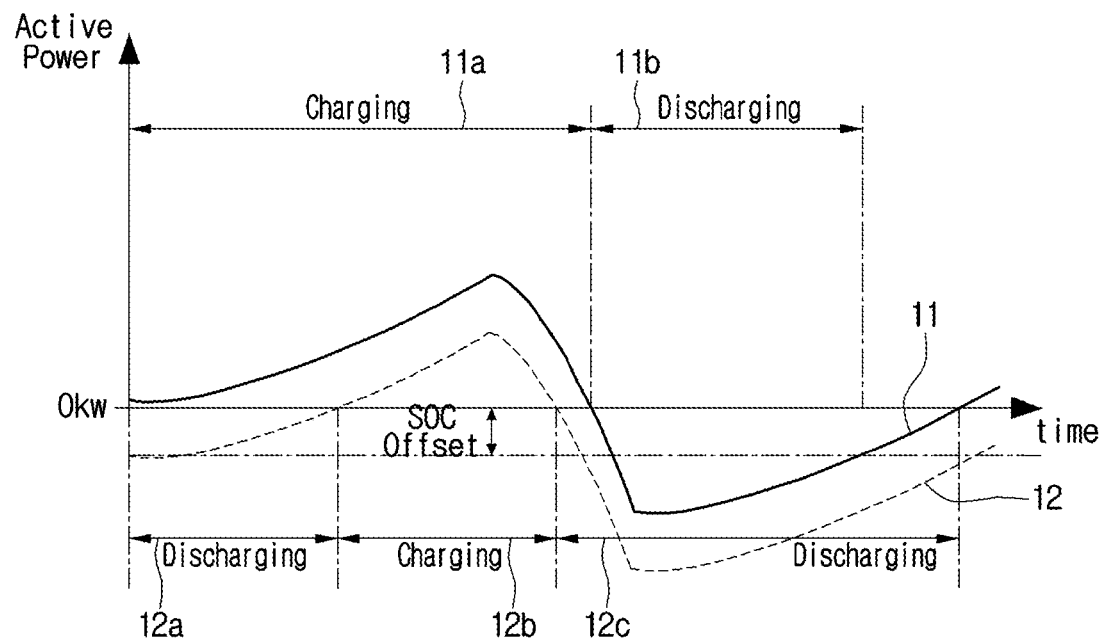
FIG. 8 illustrates an output waveform using an offset coefficient in a battery energy storage device according to an embodiment.

FIG. 8 illustrates a variation of an active power output waveform for a variation of the SOC offset value in a droop control of a battery energy storage device according to an embodiment.

Referring to FIG. 8, a charging and discharging control of the battery energy storage device may be divided into a period of battery charging and a period of battery discharging by a frequency variation in a grid.

In other words, when the frequency of the grid increases, the battery energy storage device charges the battery, and accordingly the SOC of the battery gets higher. When the frequency of the battery of the grid decreases, the battery energy storage device 1 discharges the battery and accordingly, the SOC of the battery gets lower.

On the other hand, when the SOC of the battery is higher than 50%, the SOC offset value becomes negative according to Equation (2).

When the SOC of the battery is not higher than 50%, the SOC offset value becomes positive according to Equation (2).

In other words, in Equation (2), the SOC offset value may be negative or positive.

In the graph of FIG. 8, when the SOC offset value is positive, the power output curve moves upwards on a vertical axis. On the contrary, when the SOC offset value is negative, the power output curve moves downwards on the vertical axis.

Accordingly, in the graph of FIG. 8, the first active power output waveform 11 has a charging period 11a where the active power is positive and charging is performed and a discharging period 11b where the active power is negative and discharging is performed.

On the other hand, a second active power output waveform 12 is moved downwards on the vertical axis by the SOC offset value in comparison to the first active power output waveform 11.

Accordingly, the second active power output waveform 11 has a charging period 12b where the active power is positive and charging is performed, and a discharging period 12a and 12c where the active power is negative and discharging is performed.

Consequently, comparing the first and second active power output waveforms 11 and 12, the second active power output waveform 12 has a shorter charging period and a longer discharging period than the first active power output waveform 11.

In other words, when the SOC offset value is negative, the SOC offset value becomes shorter, the charging period becomes shorter, and the discharging period becomes longer before adjustment. On the contrary, when the SOC offset value is positive, the charging period becomes longer and the discharging period becomes shorter.

That the charging period and the discharging period become shorter or longer may be differed according to a magnitude variation of the SOC offset.

In addition, that the SOC offset value is positive means that the SOC of the battery is smaller than 50% according to Equation (2). That is, when the SOC of the battery becomes smaller than 50%, the charging and discharging control of the battery energy storage device is performed so as to elongate the charging time and relatively shorten the discharging time.

On the other hand, that the SOC offset value is negative means that the SOC of the battery is greater than 50% according to Equation (2). That is, when the SOC of the battery becomes greater than 50%, the charging and discharging control of the battery energy storage device is performed so as to elongate the discharging time and relatively shorten the charging time.

Consequently, when the battery charging is performed, the SOC becomes higher. When the SOC becomes greater than 50%, since the SOC offset value becomes negative in Equation (2), the charging and discharging control is performed so as to relatively elongate the discharging time of the battery.

When the battery discharging time is relatively elongated, the SOC becomes lower. When the SOC becomes lower than 50%, since the SOC offset value is positive in Equation (2), the charging and discharging control is performed so as to relatively elongate the charging time of the battery.

When the charging time of the battery becomes relatively elongated, the SOC becomes higher. By repeating these processes, the SOC of the battery may be maintained around 50%.

Figure 9:
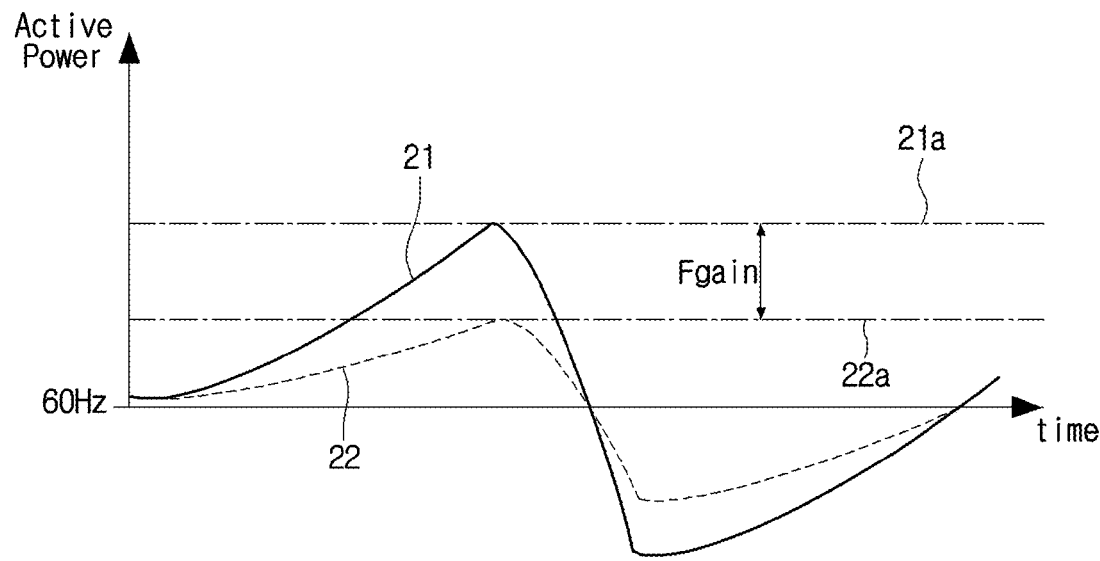
FIG. 9 illustrates an active power output waveform variation to a variation of a feedback gain value in a droop control of an energy storage device according to an embodiment.

FIG. 9 illustrates an active power output waveform variation to a feedback gain value variation in a droop control of a battery energy storage device according to an embodiment.

Referring to FIG. 9, a first active power output waveform 21 has a first feedback gain value 21a and a second active power output waveform 22 has a second feedback gain value 22a.

Accordingly, compared to the first active power output waveform 21, the second active power output waveform 22 has a lower feedback gain value by a difference Fgain between the first and second feedback gain values 21a and 22a.

Comparing the first and second active power output waveforms 21 and 22, it may be confirmed that the second active power output waveform 22 has a reduced charging amount and a reduced discharging amount in comparison to the first active power output waveform 21.

In other words, when the SOC is 50%, the feedback gain value is the highest of 1. When the SOC approaches 0% from 50% or approaches 100% from 50%, the absolute value of the SOC becomes smaller and closer to 0.

On the contrary, that the SOC is closer to 0% means over-discharging may occur. That the SOC is closer to 100% means overcharging may occur. In other words, the charging and discharging control of the battery is performed so as to reduce the charging or discharging amount when the over-charging or over-discharging is very likely to occur.

On the contrary, when the SOC is closer to 50% between 0% and 50% and is closer to 50% between 50% and 100%, the charging and discharging control of the battery is performed so as to increase the charging or discharging amount.

Briefly, when the SOC recedes from 50%, the feedback gain value is reduced closer to 0, and then the charging and discharging amounts are reduced. At this point, when the SOC is overcharged or over-discharged, a frequency droop control output value converges to 0 and the overcharging or over-discharging may be prevented.

In this way, the battery energy storage device according to an embodiment enables long time driving by reflecting the SOC offset value on a setting of the grid target power value, allowing the SOC value to be converged to a stable area, and reflecting the feedback gain value of the SOC to allow overcharge or over-discharge to be prevented, even though the battery energy storage device is operated for a long time.

Figure 10:
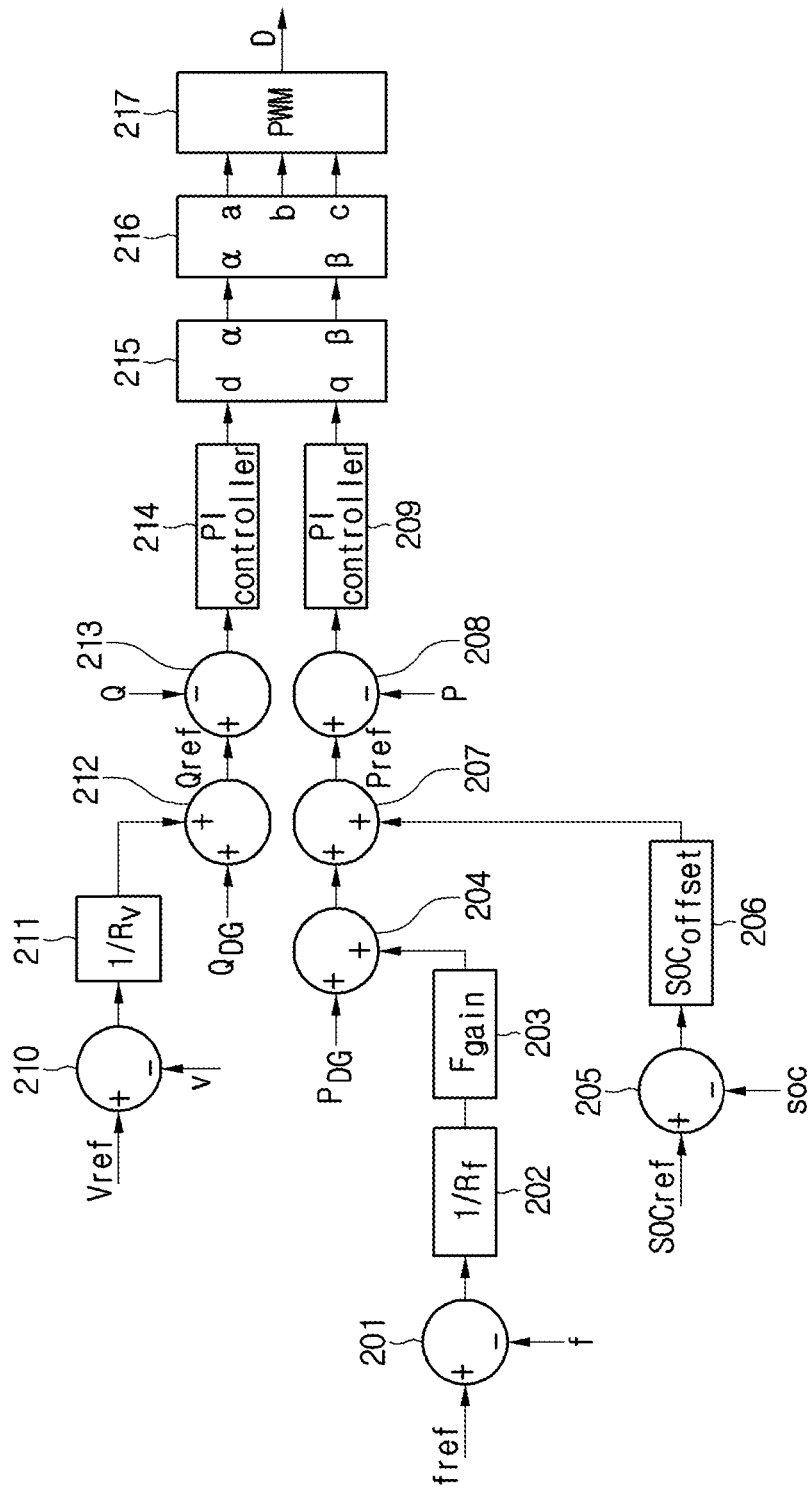
FIG. 10 illustrates a method of controlling charging and discharging of a battery energy storage device according to another embodiment.

FIG. 10 illustrates a charging and discharging control method of a battery energy storage device according to another embodiment.

Referring to FIG. 10, a first operator 201 obtains a frequency difference between a grid reference frequency f0 and a grid frequency f measured from the grid. A frequency droop coefficient operator 202 divides the frequency difference output from the first operator 201 by a frequency droop coefficient and output the divided result. A feedback gain operator 203 calculates the feedback gain value from the output value of the frequency droop coefficient operator 202 and output the calculated result.

A second operator 204 adds the feedback gain value of the feedback gain operator 106 to the grid target power value PDG and outputs the added result.

A third operator 205 obtains an SOC difference between a reference SOC value SOCref of the battery and an SOC value soc of the battery, which is measured from the battery. An SOC offset operator 206 calculates an SOC offset value from the SOC difference output from the third operator 205 and outputs the SOC offset value.

A fourth operator 207 adds the SOC offset value of the SOC offset operator 206 to an output value of the second operator 204 and outputs the added result as a reference power value Pref.

The fifth operator 208 obtains a difference between the reference power value Pref and a power value P of the grid and outputs the difference to the first PI controller 209.

The first PI controller 209 performs a proportional-integral control on the output of the fourth operator 207. At this point, an output of the PI controller 209 becomes to have a DC component.

The sixth operator 210 obtains a voltage difference between the reference value Vref and a voltage V of the grid. The voltage droop coefficient operator 211 divides the voltage difference output from the sixth operator 210 by the voltage droop coefficient and output the divided result.

The seventh operator 212 adds the output value of the voltage droop coefficient operator 211 to the grid target power value QDG and outputs the added result as a reference power value Qref.

The eighth operator 213 obtains a difference between the reference power value Qref and the power value Q of the grid and outputs the difference to the second PI controller 214.

The second PI controller 214 performs proportional-integral control on the output of the eighth operator 213. At this point, the output of the second PI controller 214 has a DC component.

The first and second conversion units 215 and 216 convert output signals of the first and second PI controller 209 and 214 from DC signals into AC signals.

At this point, the first conversion unit 215 performs conversion from a d-q axis into an α-β axis, and the second conversion unit 216 performs axis-conversion from the α-β axis to an a, b, c axis on the output of the first conversion unit 215 and a sinusoidal wave, which is a three-phase AC signal, is output.

The PWM controller 217 generates a PWM signal for controlling power of the grid from the output of the second conversion unit 216 and outputs the PWM signal.

Figure 11:
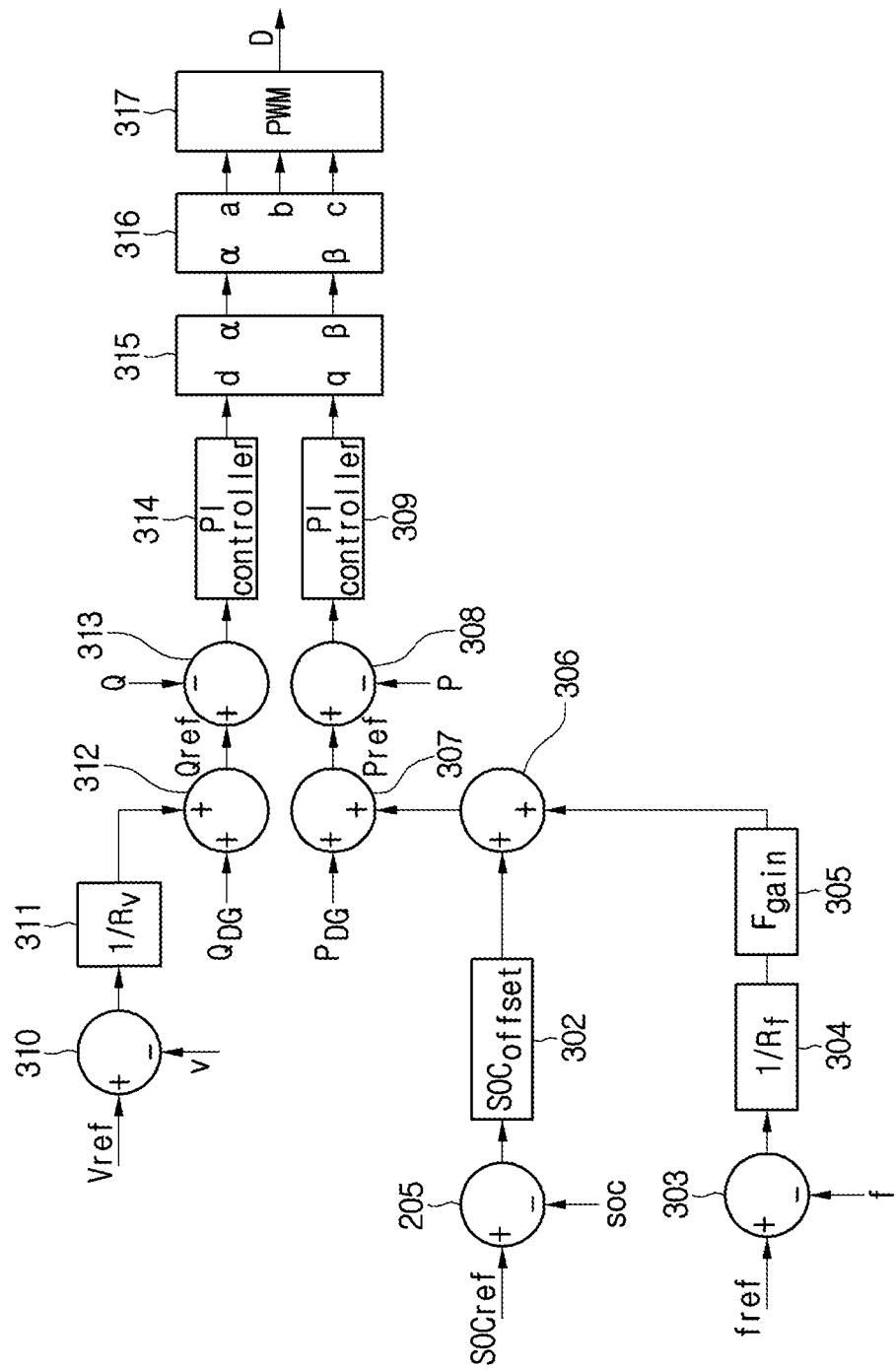
FIG. 11 illustrates a method of controlling charging and discharging of a battery energy storage device according to another embodiment.

FIG. 11 illustrates a charging and discharging control method of a battery energy storage device according to another embodiment.

Referring to FIG. 11, a first operator 301 obtains an SOC difference between a reference SOC value SOCref of the battery and an SOC value soc of the battery, which is measured from the battery. An SOC offset operator 302 calculates an SOC offset value from the SOC difference output from the third operator 301 and outputs the SOC offset value.

A second operator 303 obtains a frequency difference between a grid reference frequency f0 and a grid frequency f measured from the grid. A frequency droop coefficient operator 304 divides the frequency difference output from the second operator 303 by a frequency droop coefficient and outputs the divided result. A feedback gain operator 305 calculates a feedback gain value from the output value of the frequency droop coefficient operator 304 and outputs the calculated result.

A third operator 306 adds the feedback gain value of the feedback gain operator 305 to the SOC offset value of the SOC offset operator 302 and outputs the added result.

A fourth operator 307 adds a grid target power value PDG to the output value of the third operator 306 and outputs the added result as a reference power value Pref.

A fifth operator 308 obtains a difference between the reference power value Pref and a power value P of the grid and outputs the difference to the first PI controller 309.

The first PI controller 309 performs a proportional-integral control on the output of the fifth operator 308. At this point, an output of the PI controller 309 becomes to have a DC component.

The sixth operator 310 obtains a voltage difference between the reference value Vref and a voltage V of the grid. The voltage droop coefficient operator 311 divides the voltage difference output from the sixth operator 310 by the voltage droop coefficient and output the divided result.

The seventh operator 312 adds the output value of the voltage droop coefficient operator 311 to the grid target power value QDG and outputs the added result as a reference power value Qref.

The eighth operator 313 obtains a difference between the reference power value Qref and the power value Q of the grid and outputs the difference to the second PI controller 314.

The second PI controller 314 performs proportional-integral control on the output of the eighth operator 313. At this point, the output of the second PI controller 314 has a DC component.

The first and second conversion units 315 and 316 convert output signals of the first and second PI controller 309 and 314 from DC signals into AC signals.

At this point, the first conversion unit 315 performs conversion from a d-q axis into an α-β axis, and the second conversion unit 316 performs axis-conversion from the α-β axis to an a, b, c axis on the output of the first conversion unit 315 and a sinusoidal wave, which is a three-phase AC signal, is output.

The PWM controller 317 generates a PWM signal for controlling power of the grid from the output of the second conversion unit 316 and output the PWM signal.

According to the embodiments, by using SoC values of a battery and reflecting an SOC offset value on setting of a grid target power value, the SOC value can be converged to a stable area. By reflecting a feedback gain value of SOC and preventing overcharging and over-discharging from occurring, driving for a long time is possible by allowing overcharging or over-discharging not to occur despite of long time operation of a battery energy storage device.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of charging and discharging battery energy storage device, comprising:
   storing, in a data storage, data necessary for a voltage droop control and a frequency droop control for a battery;
   measuring, via a SOC measuring unit, a SOC value of the battery;
   measuring, via a grid voltage and frequency measuring unit, a voltage and a frequency of the grid;
   performing, via a charging and discharging control unit, the voltage droop control and frequency droop control corresponding to the voltage and frequency of the grid by using the data stored in the data storage, a SOC offset value, and a SOC feedback gain value of the battery, which are calculated on the basis of the SOC value;
   outputting, via the charging and discharging control unit, a control signal for performing charging and discharging on the battery while preventing overcharging and over-discharging at the time of charging and discharging the battery; and
   charging or discharging the battery, via a charging and discharging unit, according to the control signal.

2. The method according to claim 1, wherein charging or discharging the battery comprises adjusting a charging period and a discharging period of an entire period on the basis of the SOC offset value.

3. The method according to claim 2, wherein the SOC offset value is calculated according to the following equation:

$$SOC_{offset} = \frac{SOC_{ref} - SOC_{feed}}{100} * P\max$$

where, SOCref denotes a reference SOC value, SOCfeed denotes a SOC value measured in the battery, and Pmax denotes maximum power of the grid.

4. The method according to claim 3, wherein the SOCref is a median value 50% of the SOC, and
   when the SOC is 50%, the SOC offset value becomes 0,
   when the SOC is between 0% and 50%, an absolute value of the SOC offset value increases as the SOC approaches 0% in a state where the SOC offset value has a positive value, and
   when the SOC value is between 50% and 100%, the absolute value of the SOC offset value increases as the SOC approaches 100% in a state where the SOC offset value has a negative value.

5. The method according to claim 1, wherein charging or discharging the battery comprises adjusting a charging amount and a discharging amount on the basis of the SOC feedback gain value.

6. The method according to claim 5, wherein the SOC feedback gain value is calculated by the following equation:

$$\text{If } SOC \leq 50$$
$$\frac{SOC_{feed}}{100} * 2$$
$$\text{Else if } SOC > 50$$
$$\left\| \frac{SOC_{feed}}{100} * 2 - 2 \right\|$$

where, SOCfeed denotes a SOC value of the battery.

7. The method according to claim 1, wherein charging or discharging the battery comprises:
   operating the SOC offset value to a grid target power value set in the grid and outputting a first operation result;
   operating a frequency droop coefficient to a frequency difference between a reference frequency of the grid and a measured frequency of the grid and outputting a second operation result;
   operating the SOC feedback gain value to the frequency droop coefficient operation result and outputting a second operation result;

operating the second operation result to the first operation result and outputting a reference power value; and obtaining a difference between the reference power value and a power value of the grid and performing a charging and discharging control.

8. The method according to claim 1, wherein charging or discharging the battery comprises:
   operating a frequency droop coefficient to a frequency difference between a reference frequency of the grid and a measured frequency of the grid;
   operating the SOC feedback gain value to the frequency droop coefficient operation result and outputting a first operation result;
   operating the first operation result to the grid target power value set to the grid and outputting a second operation result;
   operating the SOC offset value to the second operation result and outputting a reference power value; and
   obtaining a difference between the reference power value and the grid power value and controlling the charging and discharging.

9. The method according to claim 1, wherein charging or discharging the battery comprises:
   operating a frequency droop coefficient to a frequency difference value between a reference frequency of the grid and the measured frequency of the grid;
   operating the SOC feedback gain value to the frequency droop coefficient operation result and outputting a first operation result;
   operating the SOC offset value and the first operation result and outputting a second operation result;
   operating the second operation result to the grid target power value set to the grid and outputting a reference power value; and
   obtaining a difference value between the reference power value and a power value of the grid and performing a charging and discharging control.

10. A battery energy storage device comprising:
    a battery;
    a data storage unit configured to store data necessary for a voltage droop control and a frequency droop control for the battery;
    a SOC measuring unit configured to measure a SOC value of the battery;
    a grid voltage and frequency measuring unit configured to measure a voltage and a frequency of the grid;
    a charging and discharging control unit configured to:
    perform the voltage droop control and frequency droop control corresponding to the voltage and frequency of the grid by using the data stored in the data storage unit, a SOC offset value and a SOC feedback gain value of the battery, which are calculated on the basis of the SOC value; and
    output a control signal for performing charging and discharging on the battery while preventing overcharging and over-discharging at the time of charging and discharging the battery; and
    a charging and discharging unit configured to charge or discharge the battery according to the control signal.

11. The battery energy storage device according to claim 10, wherein the data storage unit is further configured to store a voltage droop control coefficient, a frequency droop control coefficient, a reference SOC value of the battery, a reference voltage value of the grid, a reference frequency value of the grid, and a target power value of the grid.

* * * * *